United States Patent [19]

Horne et al.

[11] Patent Number: 5,344,352
[45] Date of Patent: Sep. 6, 1994

[54] METHOD OF MANUFACTURING A POINTED ELECTRODE, AND DEVICE FOR USING SAID METHOD

[75] Inventors: Remko Horne; Cornelius A. Van Den Heuvel; Gerardus N. A. Van Veen, all of Eindhoven, Netherlands

[73] Assignee: U.S. Philips Corporation, New York, N.Y.

[21] Appl. No.: 39,610

[22] Filed: Mar. 24, 1993

[30] Foreign Application Priority Data

Apr. 2, 1992 [EP] European Pat. Off. ......... 92200939.4

[51] Int. Cl.⁵ .............................................. H01J 9/02
[52] U.S. Cl. ....................................... 445/024; 445/50; 204/192.15
[58] Field of Search ........................ 445/24, 49, 50; 204/192.12, 298.11, 192.15

[56] References Cited

U.S. PATENT DOCUMENTS

| 4,824,544 | 4/1989 | Mikalesen et al. ............. 204/298.11 |
| 4,857,161 | 8/1989 | Borel et al. ........................ 445/24 X |
| 5,007,873 | 4/1991 | Goronkin et al. ..................... 445/49 |
| 5,141,459 | 8/1992 | Zimmerman ........................... 445/50 |

FOREIGN PATENT DOCUMENTS 0440377 7/1991 European Pat. Off. .
9112627 8/1991 PCT Int'l Appl. .

OTHER PUBLICATIONS

Rossnagel et al *Journal of Vacuum Science Technology* A 9(2), Mar./Apr. 1991 pp. 261–265.

*Primary Examiner*—Kenneth J. Ramsey
*Attorney, Agent, or Firm*—John C. Fox

[57] ABSTRACT

The manufacture of pointed electrodes (28) (field emitters) is considerably simplified by a directed sputtering deposition instead of by vapor deposition. Directed deposition of the material (12) to be sputtered can be effected by means of a collimating filter (4) and, if necessary, a cover plate (8).

9 Claims, 5 Drawing Sheets

METHOD OF MANUFACTURING A POINTED ELECTRODE, AND DEVICE FOR USING SAID METHOD

BACKGROUND OF THE INVENTION

The invention relates to a method of manufacturing, on a substrate, at least one electrode whose cross-section parallel to a main surface of the substrate is larger at the base than at the top in which method material for forming the electrode is deposited on the substrate via an apertured mask parallel to a main surface of the substrate, the material also growing on the mask in a lateral direction within the aperture during deposition.

Such an electrode may be conical or pyramid-shaped, but also, for example wedge-shaped. At this main surface the substrate may already be provided with, for example, metal tracks on which the material is deposited.

The invention also relates to an electrode manufactured by such a method, which electrode may function, for example, as an electron source (field emitter) or ionizer.

Such electron sources are particularly useful in flat display devices. The ionizers are notably used in scientific apparatus.

A method of the type mentioned in the opening paragraph is described in U.S. Pat. No. 5,007,873. In this method, the electrodes (field emitters) are obtained by depositing the electrode material through a mask on to the substrate by vapour deposition in which the material for manufacturing the electrodes is released from a source by electron beam vapour deposition. The greater part of the electrode material is deposited on the surface of the substrate perpendicularly or at a small angle with respect to the normal. Due to growth of electrode material in the lateral direction at the location of the apertures in the mask, a part of this material causes these apertures to become gradually smaller, and the cross-sections of the growing electrodes become smaller so that the electrodes acquire a pointed, for example, a conical shape.

If the electrode is used as a (field) emitter, it is necessary for a satisfactory emission that said point or cone has an acute apex angle. Moreover, to obtain a uniform setting throughout the image when using larger flat display devices having a plurality of emitters per pixel, there should not be too much spread in the shapes of the emitters. This means that the source from which the material is released should be placed far remote from the substrate. The vacuum installation to be used then becomes disproportionately large and expensive, while evacuation also takes a long time. Moreover, the material choice is limited when these types of methods (vapour deposition, electron beam deposition) are used, because measures should generally be taken to achieve relaxation of mechanical stress in the layer growing on the mask.

OBJECTS AND SUMMARY OF THE INVENTION

It is, inter alia an object of the invention to provide a method of manufacturing such pointed electrodes which can be used on an industrial scale and with simple equipment.

It is another object of the invention to provide such a method which a large number of material may be used.

To this end the method according to the invention is characterized in that it comprises at least one step in which material for manufacturing the electrode is deposited by sputtering in a direction substantially perpendicular to the main surface of the substrate.

In this respect, substantially perpendicular is understood to mean that a part of material to be sputtered may be deposited on the main surface at a small angle (up to approximately 15 degrees) with respect to the normal.

The use of sputtering not only has the advantage that a smaller vacuum than with vapour deposition is sufficient, but also a large number of materials can be used for deposition without the necessity of using a second material for realising relaxation in the deposited closing layer, as is the case when using the method of vapour deposition. Moreover, materials can be deposited in a simple manner from a plurality of components (such as, for example zirconium carbide, which has a very low work function) by means of sputtering. Even when the constituents are not released in the correct proportions due to unequal sputtering rates at the source, there is still such a state or balance at the source that material of the desired composition is deposited on the substrate.

However, in the case of vapour deposition, two sources which must be arranged at slightly different angles (with respect to the substrate) have to be used already at slightly different vapour pressures of the constituents. To obtain a substantially perpendicular incidence of the material, these sources have to be arranged far away from the substrate, which renders the manufacture much more complicated (hence more expensive), while evacuation of such a device takes a longer time and is more expensive.

More generally, sputtering requires less space than vapour deposition, so that less evacuation capacity is sufficient. Other advantages of sputtering as compared with vapour deposition are:
1) more efficient use of material
2) a better (larger) deposited, which adds to the lifetime of the emitters
3) wider processing tolerances; in sputtering a larger number of parameters is adjustable, such as, for example, sputtering pressure (pressure of an inert gas such as argon present in the sputtering space) and the voltage on the substrate.

For example, sputtering in a direction substantially perpendicular to the main surface can be achieved in that the material to be sputtered or a constituent thereof is obtained in a particle-generating portion having an exit aperture, while at least a particle-collimating filter is present between the exit aperture and the mask. The stream of particles which has a considerable spatial spread in directional components after it has left the particle-generating portion is directed, as it were, by the filter and acquires such a distribution in directional components that the particles are deposited substantially perpendicularly to the main surface of the substrate. The exit aperture is preferably larger than the main surface of the substrate so as to prevent peripheral effects.

The particles can be generated in a plasma in a magnetron accommodating a source with the material to be deposited (or a constituent thereof), as is further described in EP-A-0 440 377.

In another embodiment, the particles are generated in a magnetron with a hollow cathode as described in greater detail in U.S. Pat. No. 4,824,544, whose contents are herein incorporated by reference.

The filters generally comprise a plurality of parallel ducts having, for example a square, hexagonal or circular cross-section.

As has been stated hereinbefore, it is important that field emission cathodes have a structure which is as uniform as possible when manufacturing display devices in which such field emission cathodes are used. To achieve this, the substrate, the filter and the sputtering source may be moved parallel with respect to each other to the main surface, for example during deposition. This may involve a rotation but also, for example a translation in which the substrate is led along different sources and the type of deposition (material, deposition rate) is varied dependent on the source.

The uniformity can be improved by providing a cover plate between the filter and the mask, said cover plate, in a cross-section of the filter perpendicular to the axis of the filter, having apertures of substantially the same size as the particle-passing apertures. Substantially the same size is herein understood to mean that the diameters of the apertures in the cover plate differ by at most 20% from those of the apertures in the filter.

A further preferred embodiment of a method according to the invention is characterized in that the particle-collimating filter is present on the mask. Little material is then lost. In this case the filter may comprise a plate having apertures at the location of the areas where electrode material is to be deposited; notably if a pixel is made which comprises a plurality of emitters per pixel and if the apertures coincide with the area of a pixel, the emitters within one pixel are equal in shape due to this measure and consequently have a uniform emission behaviour; if necessary, the filter may comprise a plurality of such plates (or it may even be temporarily provided on the substrate by use of deposition techniques).

The method may also be used for manufacturing a structure which is further provided with, for example a metal layer and an extra layer of insulating material. An electron source (field emitter) provided with a grid electrode is obtained by means of such a method.

A further method according to the invention is characterized in that the electrodes are manufactured in a plurality of steps, with particle-collimating filters being used in consecutive steps, whose apertures passing the particles, viewed in a cross-section, have smaller sizes in consecutive steps.

In this method a coarse structure may initially be provided while using a small quantity of material and a filter having large apertures; the ultimate point, which is necessary for, for example, field emission, is then obtained via a filter having smaller apertures.

BRIEF DESCRIPTION OF THE DRAWINGS

These and other aspects of the invention will become apparent from the embodiments described hereinafter and elucidated with reference to the drawings, in which;

FIG. 8 shows diagrammatically another embodiment of a device according to the invention, while

DESCRIPTION OF THE PREFERRED EMBODIMENTS

Figure 1:
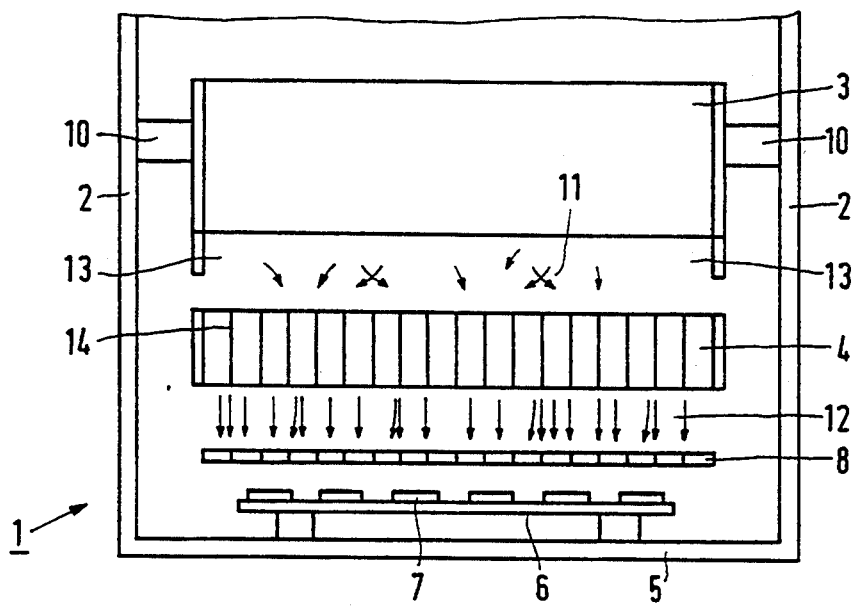
FIG. 1 shows diagrammatically a sputtering device with which the method according to the invention can be performed, FIGS. 2a, b, and c are diagrammatic cross-sections of a field emitter during different stages of manufacture in accordance with the method of the invention.

FIG. 1 shows diagrammatically a cylindrical sputtering device 1 with walls 2. A particle-generating portion 3 in which, for example, molybdenum particles 11 are generated, is present within the cylinder. The particle-generating portion 3 is secured to the walls 2 by securing means 10 which are not further described. The particles pass a collimating filter 4, which is composed, for example, of a plurality of densely packed tubular parts, and then impinge on a substrate 7 which is present on a mounting table 6. A plurality of substrates 7 may be present on the mounting table 6. The particles 11 acquire a direction substantially perpendicular to the substrate 7 (particles 12) in the filter 4. In this embodiment a cover plate 8 having apertures, whose function will hereinafter be described, is present between the filter 4 and the substrate 7. The device 1 also has means (not shown) for generating a plasma, means for setting pressure and temperature, etc.

A portion of the particles 12 has a small deviation with respect to this perpendicular direction (up to, for example 15 degrees). The maximum deviation is determined by the ratio between the length and the diameter of the tubular parts, which is between 1:2 and 1:10.

A substrate 7 (FIG. 2) comprises, for example a layer of glass having a main surface 20 on which molybdenum strips 21 having a thickness of approximately 0.3 $\mu$m are provided, for example, by first providing a layer of molybdenum 21 and subsequently etching in accordance with a pattern in a suitable etchant. Subsequently a layer of silicon oxide 22 is provided which is coated with a layer 23 of molybdenum.

Figure 2A:
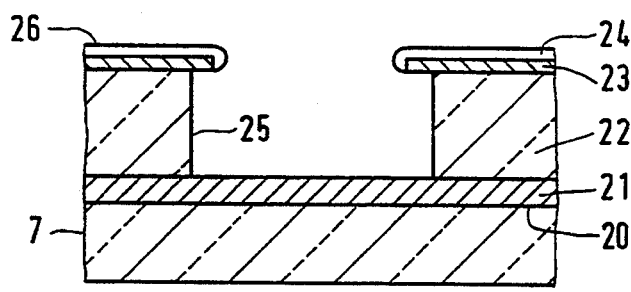

If necessary, the layer 23 is first divided into strip-shaped bands which together with the strips 21 define a matrix structure. The strip-shaped bands also have apertures 25; the silicon oxide is removed at the location of these apertures, for example, by means of dry etching. Subsequently a lift-off layer 24 of aluminum oxide is provided by means of an oblique vapour deposition process. By vapour depositing obliquely, aluminum oxide is prevented from being deposited on the bottom (and the walls) of the aperture 25. The device of FIG. 2a is thereby obtained. The double layer 23, 24 functions as a mask in the next step.

Figure 2B:
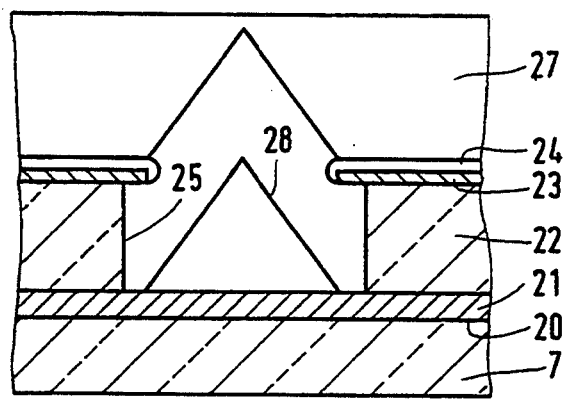

One or more of these substrates is subsequently placed on the table 6 in the sputtering device 1. Molybdenum particles generated in the portion 3 and subsequently passed through the filter 4 are deposited (in this example) by means of sputtering on the surface 26 of the double layer 23, 24 and strips 21 located on the substrate 7. Since a certain spread in the direction of the particles occurs (for example, up to approximately 10 degrees around the perpendicular to the surface 26 the growing layer 27 of molybdenum above the apertures 26 also grows laterally at the location of these apertures and gradually closes until the situation of FIG. 2b is achieved.

Figure 2C:
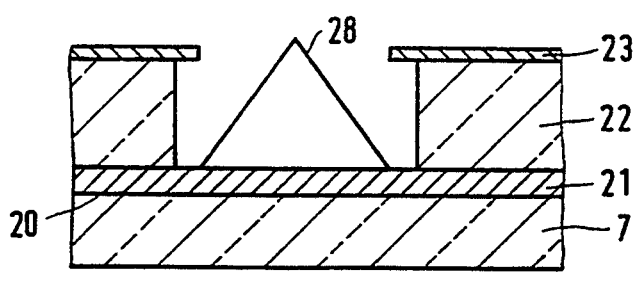

As growth as the layer 27 proceeds the aperture through which material to be deposited is passed becomes smaller, resulting in deposition of a pointed body 28 within the apertures are 25. In this embodiment, the body 28 is cone-shaped because the apertures 25 are chosen to be round and sputtering is continued until the aperture is completely closed. Subsequently the lift-off layer 24, and consequently the layer 27, are removed, and the device according to FIG. 2c is obtained.

The (molybdenum) particles 11 may be generated in the portion 3 by a magnetron in which a source is present on the cathode plate with the material from which the particles are formed, as described in EP-A-0 440 377. Another possibility is described in U.S. Pat. No. 4,824,544, in which the source is placed on a magnetron assembly within a chamber whose (vacuum) wall also functions as an anode; the cathode is a hollow cathode which is isolated from the vacuum wall. The ions of the combined plasma thus obtained bombard a particle source which supplies the particles 11 or composite particles to be sputtered. These particles leave the particle-generating portion 3 via an exit aperture 13.

The particles 11 thus obtained subsequently reach the filter 4 where they acquire a direction with a component substantially perpendicular to the mounting table 6 (and hence to the main surface 20 of the substrate 7). At the location of the exit apertures of the filter, a plurality of exiting particles 12 has a deviating directional component. Closure of the layer 27 by means of growth as described with reference to FIG. 2b is then realised.

Figure 3:
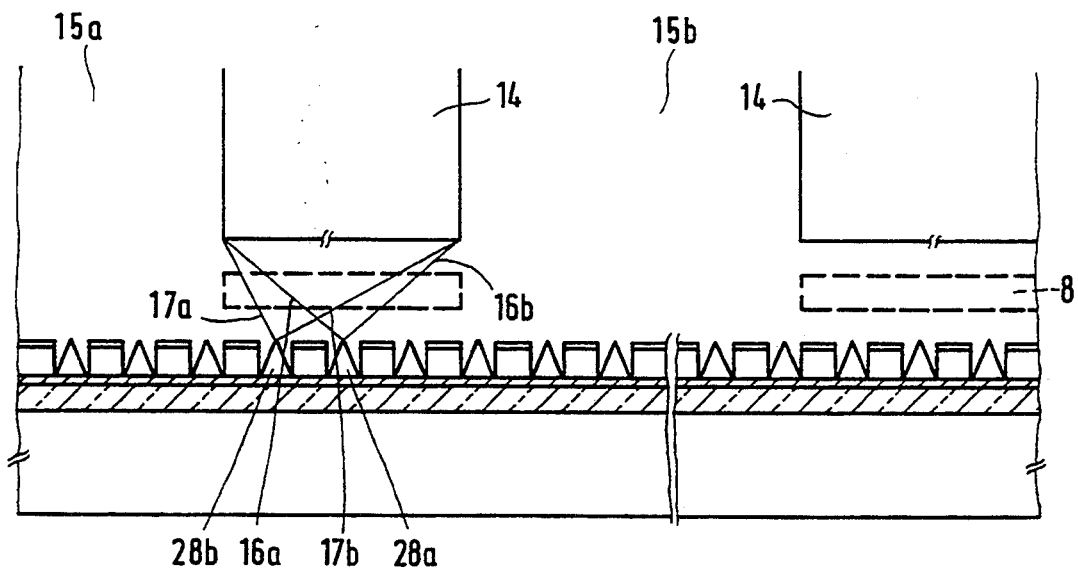
FIG. 3 shows diagrammatically a part on a larger scale of the device of FIG. 1.

As described in the opening paragraph, it is important for a uniform electron emission that the electrode bodies 28 are mutually equal as much as possible when they are used as field emitters. This is not very well possible without extra measures, notably under the walls 14 of the ducts. The duct walls 14 of the composite parts of the filter may have a large thickness as compared with the mutual distance of juxtaposed apertures 25 in the layer 22. This may give rise to a non-uniform growth, notably of the pointed emitters 28 located under these duct walls. This will be further explained with reference to FIG. 3.

The emitter 28a halfway between the apertures 15a and 15b, receives an approximately equal quantity of material from both apertures (approximately along the lines 16a and 16b). However, this material is deposited with a larger horizontal component than that for an emitter located directly underneath one of the apertures 15, so that this emitter will have a blunter (and lower) point than the emitters underneath the apertures 15. The emitter 28b receives material from the aperture 15a at a different horizontal rate component (line 17a) than from the opening 15b (line 17b) while this is conversely true for the emitter 28c. This leads to a non-uniform growth of these emitters, which becomes manifest in a non-uniform emission in the ultimate display device.

This non-uniform growth can be obviated by giving the substrate a continuous movement such as a rotation about a central axis or a translation. If necessary, a cover plate 8 may be arranged between the filter 4 and the substrate 7, provided with 23, corresponding in this embodiment to those of the filter 4. The lateral growth of the layer 27 is now only caused by particles 12 having a small horizontal directional component. Emitters 28 having an extra sharp point are then obtained.

Figure 4:
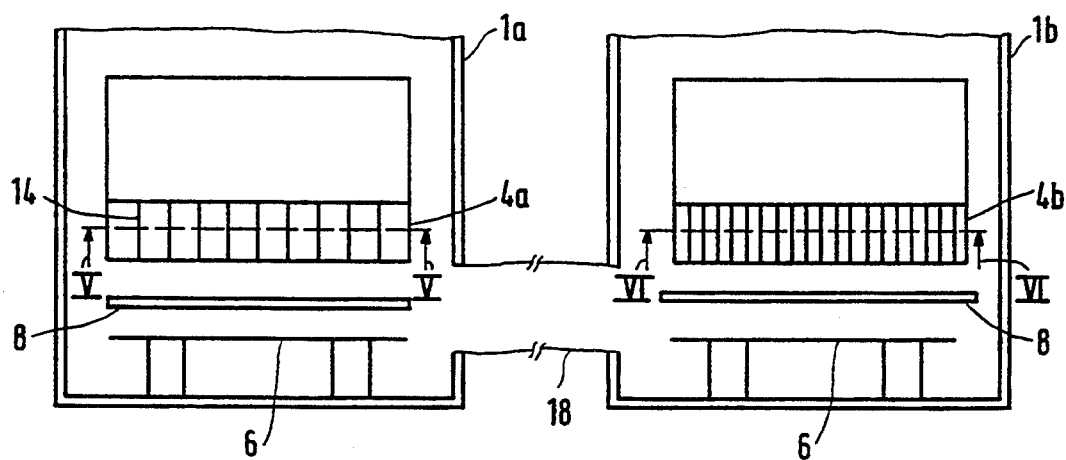
FIG. 4 shows diagrammatically an arrangement of a plurality of sputtering devices for performing the method of the invention.
Figure 5:
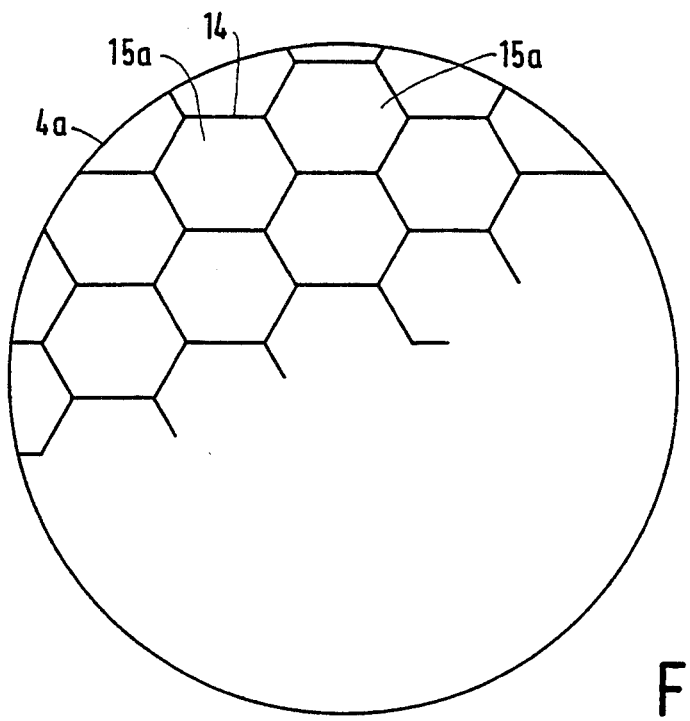
FIGS. 5 and 6 are diagrammatic cross-sections taken on the lines V—V and VI—VI, respectively, in FIG. 4.
Figure 6:
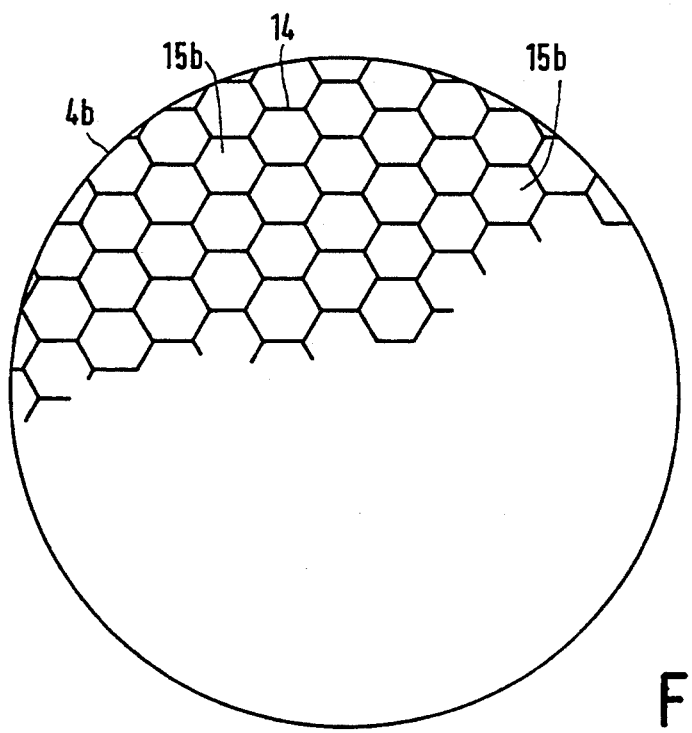
Figure 7:
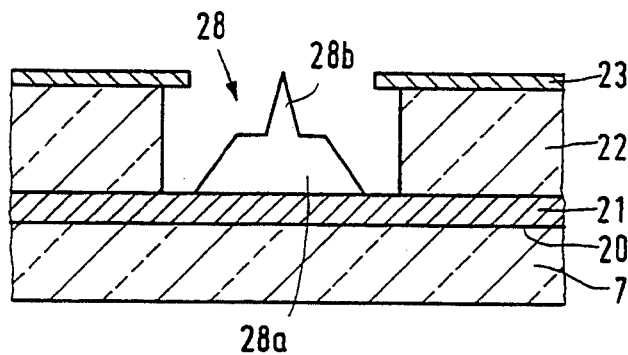
FIG. 7 shows diagrammatically a field emitter obtained by means of the arrangement of FIG. 4.

As the apertures 15 in the filter have a smaller diameter, the horizontal component of the rate of the particles 12 decreases so that the points of the emitters 28 become sharper, hence improving the efficiency of the emitters to be manufactured. On the other hand, the closing layer 27 will also become considerably thicker, while a larger quantity of material is left on a possibly present cover plate 8. This may be largely prevented by using a device as shown in FIG. 4. It comprises, for example, two component devices 1a, 1b, each as described with reference to FIG. 1. In the first device 1a the filter 4a (and a possible cover plate 8a) has, for example a coarse structure with large hexagonal apertures 15a (see FIG. 5). The particles 12 have a larger rate component perpendicular to the normal so that the layer 25 grows and closes more rapidly. Initially, the emitters 28 grow with a less sharp slope, but less material is lost and the process is faster. However, before the layer 25 has fully grown and closed, the substrate is moved via a vacuum lock 18 or another means to the device 1b which is substantially analogous to the device 1a, except that the apertures 15b in the filter 4b have a smaller diameter (see FIG. 6). The last part of the emitters is then formed in the device 1b. FIG. 7 shows the completed emitter 28 comprising a part 28a formed in device 1a and a sharp point 28b formed in device 1b. After mounting in a display device, the actual emission takes place in points 28b which are very sharp and uniform in their emission behaviour due to a suitable choice of the sputter parameters and the filter dimensions in device 1b. These steps may also be performed within one one device by replacing the filter 4a (and possibly an associated cover plate 8a) after some time by the filter 4b (and the associated cover plate 8b) having smaller apertures. The filters 4a and 4b may also be accommodated in one device 1, while intermediate steps with filters of a different diameter are also possible.

Figure 8:
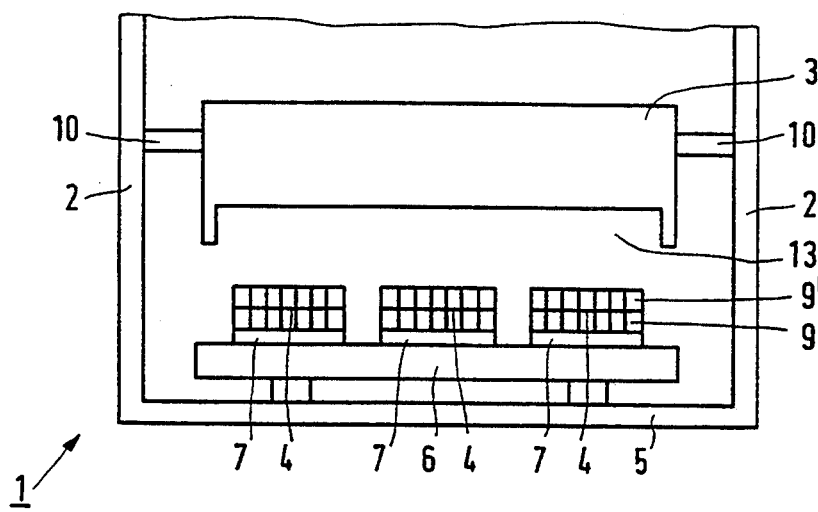

FIG. 8 shows diagrammatically a device in which the filters 4 are provided on different substrates 7 which already have a structure as shown in FIG. 1a. This may be effected, for example by providing plates 9 of, for example glass on these structures, which plates have apertures at the location of those areas where electrode material must be deposited on the lift-off layer 24 and in the apertures 25. When using apertures which coincide with a pixel having a plurality of electrodes per pixel, the electrodes within one pixel hardly vary in shape and consequently have a uniform emission behavior. In order to deposit the molybdenum particles on the surfaces of the substrates 7 at a smaller angle with respect to the normal, extra plates 9' may be used. Also, a temporary pattern of the desired shape of, for example polyimide which is removed after completion may be used. Otherwise, the reference numerals denote the same parts as in FIG. 1. Here again, the maximum deviation of the angle with respect to the normal is determined by the ratio of the length and the diameter of the apertures in the plates 9' and the assembly of plates.

Figure 9:
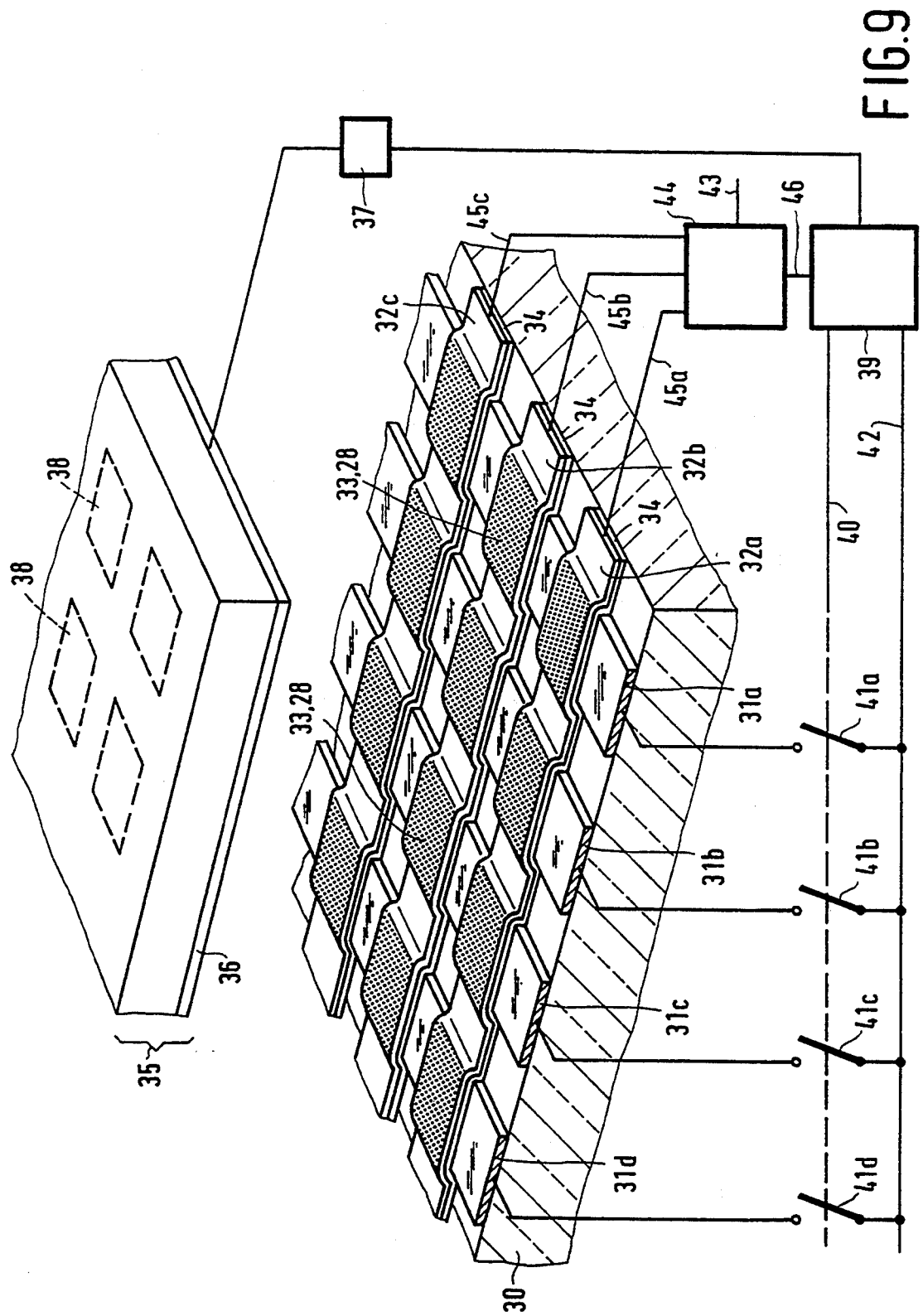
FIG. 9 is a diagrammatic elevational view of a part of a display device comprising field emitters manufactured by the method according to the invention.

FIG. 9 is a diagrammatic elevational view of a flat display device 50 having a large number of (field) emitters 28 per pixel. This display device comprises a crossbar or matrix system of row conductors 31 and column conductors 32 on a substrate 30, which conductors are mutually insulated by a layer 34 of silicon oxide under the column conductors 32. For the sake of simplicity, the column conductors 32 and the layer 34 have been shown as a whole in the greater part of FIG. 8. At the location of the crossings, the double layer 32, 34 has apertures 33 (approximately 200 per crossing) within which the (field) emitters 28 are located by, for example, the described hereinbefore. Due to the manner of manufacture, these emitters have a very uniform emission behaviour throughout the surface of the display device.

The face plate 35 has a conducting layer 36 and phosphors (not shown). A voltage may be applied between the layer 36 and the row conductors 31 by means of a voltage source 37 so as to create an accelerating field between the plates 30 and 35, so that electrons generated by the (field) emitters 28 are accelerated towards the face plate 35 where they cause pixels 38 to luminesce. To this end, a control unit 39 connects the row conductors 31 successively to a voltage line 42 via switches 41 by means of a control line 40. Incoming information 43 is applied to the column conductors 32 (for example, via shift registers 44) and connection lines 45. Mutual synchronization is effected via the line 46.

Figure 10:
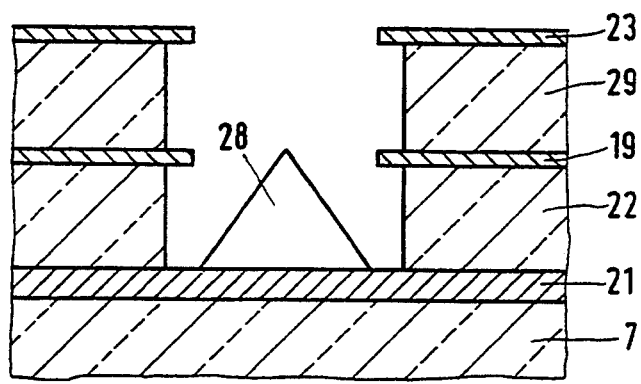
FIG. 10 is a cross-section of a field emitter manufactured by the method according to the invention.

The invention is of course not limited to the embodiments described, but several variations are possible within the scope of the invention. For example, before the first lift-off mask 24 is provided, a metal layer 19 and a second layer 29 of insulating material can be provided. After using a method according to the invention, a device as shown in FIG. 10 having an extra grid 19 is obtained.

Instead of passing a single collimating filter 4, the particles may alternatively pass a plurality of such filters which may have different sizes of the apertures 15. The same applies to the cover plate in the device of FIG. 1.

We claim:

1. A method of manufacturing, on a substrate, at least one electrode whose cross-section parallel to a main surface of the substrate is larger at the base than at the top, the method comprising depositing material for forming the electrode on an apertured mask parallel to a main surface of the substrate and on the substrate via the aperture, the material on the mask also growing in a lateral direction within the aperture during deposition, characterized in that the deposition is at least partially carried out by sputtering in a direction substantially perpendicular to the main surface of the substrate.

2. A method as claimed in claim 1, characterized in that the material to be sputtered or a constituent thereof, is in the form of particles obtained in a particle generator having an exit aperture, and in that the particles are collimated prior to deposition in a particle-collimating filter present between the exit aperture and the mask.

3. A method as claimed in claim 2, characterized in that the particles are additionally collimated in a cover plate present between the particle-collimating filter and the mask, said cover plate, viewed in a cross-section of the filter perpendicular to the axis of the filter, having apertures of substantially the same size as the particle-passing apertures.

4. A method as claimed in claim 3, characterized in that during sputtering the substrate is moved with respect to the sputtering source and/or the filter within the plane of the substrate.

5. A method as claimed in claim 3, characterized in that the electrodes are manufactured in a plurality of steps, with particle-collimating filters being used in consecutive steps, whose apertures passing the particles, viewed in a cross-section, have smaller sizes in consecutive steps.

6. A method as claimed in claim 2, characterized in that the particle-collimating filter is present on the mask.

7. A method as claimed in claim 5, characterized in that during sputtering the substrate is moved with respect to the sputtering source and/or the filter within the plane of the substrate.

8. A method as claimed in claim 2, characterized in that during sputtering the substrate is moved with respect to the sputtering source and/or the filter within the plane of the substrate.

9. A method as claimed in claim 2, characterized in that during deposition, a plurality of particle-collimating filters having consecutively smaller sized apertures, are used in consecutive steps.

* * * * *